United States Patent
Hung et al.

(10) Patent No.: US 12,131,787 B2
(45) Date of Patent: Oct. 29, 2024

(54) PAGE BUFFER COUNTING FOR IN-MEMORY SEARCH

(71) Applicant: MACRONIX INTERNATIONAL CO., LTD., Hsinchu (TW)

(72) Inventors: Shuo-Nan Hung, Hsinchu (TW); E-Yuan Chang, Chiayi (TW); Ji-Yu Hung, Miaoli (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 155 days.

(21) Appl. No.: 17/891,589

(22) Filed: Aug. 19, 2022

(65) Prior Publication Data

US 2024/0062833 A1    Feb. 22, 2024

(51) Int. Cl.
*G11C 16/26* (2006.01)
*G11C 16/04* (2006.01)
*G11C 16/24* (2006.01)
*H03K 19/20* (2006.01)

(52) U.S. Cl.
CPC .......... *G11C 16/26* (2013.01); *G11C 16/0483* (2013.01); *G11C 16/24* (2013.01); *H03K 19/20* (2013.01)

(58) Field of Classification Search
CPC ..... G11C 16/26; G11C 16/0483; G11C 16/24; H03K 19/20
See application file for complete search history.

(56) References Cited

U.S. PATENT DOCUMENTS

| | | | |
|---|---|---|---|
| 6,867,991 B1* | 3/2005 | Tezcan | G11C 15/00 365/49.16 |
| 7,110,275 B2 | 9/2006 | Park | |
| 8,169,808 B2 | 5/2012 | Roohparvar | |
| 8,599,613 B2 | 12/2013 | Abiko et al. | |
| 10,127,150 B2 | 11/2018 | Sprouse et al. | |
| 10,318,168 B2 | 6/2019 | Lea et al. | |
| 10,403,352 B2 | 9/2019 | Hush et al. | |
| 2014/0237263 A1* | 8/2014 | Suzuki | G06F 12/0246 713/193 |

(Continued)

FOREIGN PATENT DOCUMENTS

| | | |
|---|---|---|
| TW | I696917 B | 6/2020 |
| TW | 202221718 A | 6/2022 |

(Continued)

*Primary Examiner* — Min Huang
(74) *Attorney, Agent, or Firm* — Andrew L. Dunlap; Haynes Beffel & Wolfeld LLP (57) ABSTRACT

A memory such as a 3D NAND array, having a page buffer having page buffer cells coupled to bit lines has a search word input such as a search word buffer coupled to word lines. A circuit, such as string select gates, is provided to connect a selected set of memory cells in the array to the page buffer. The page buffer includes sensing circuitry configured to apply a match sense signal to a latch in a plurality of storage elements for a stored data word and an input search word. Logic circuitry uses storage elements in the plurality of storage elements of the page buffer to accumulate the match sense signals output by the sensing circuitry over a sequence matching a plurality stored data words to one or more input search words. A match for a search is based on a threshold and the accumulated match sense signals.

20 Claims, 6 Drawing Sheets

(56) References Cited

U.S. PATENT DOCUMENTS

| | | | |
|---|---|---|---|
| 2016/0172037 A1* | 6/2016 | Lee | G11C 16/26 365/185.12 |
| 2017/0293644 A1* | 10/2017 | Kurokawa | G06F 16/24542 |
| 2020/0192971 A1 | 6/2020 | Lue et al. | |
| 2021/0280250 A1* | 9/2021 | Advani | G11C 16/0483 |
| 2022/0044090 A1* | 2/2022 | Yoo | G06N 3/02 |

FOREIGN PATENT DOCUMENTS

| TW | 202232325 A | 8/2022 |
|---|---|---|
| TW | I773171 B | 8/2022 |

* cited by examiner

| STATE | LD | L1 | L2 | L3 | L4 |
|---|---|---|---|---|---|
| Initial | 0 | 0 | 0 | 0 | 0 |
| S1 – D1 | | | | | |
| Mismatch | 1 | 0 | 0 | 0 | 0 |
| Counting | 1 | 1 | 0 | 0 | 0 |
| Reset LD | 0 | 1 | 0 | 0 | 0 |
| S2 – D2 | | | | | |
| Mismatch | 1 | 1 | 0 | 0 | 0 |
| Counting | 1 | 1 | 1 | 0 | 0 |
| Reset LD | 0 | 1 | 1 | 0 | 0 |
| S3 – D3 | | | | | |
| Mismatch | 1 | 1 | 1 | 0 | 0 |
| Counting | 1 | 1 | 1 | 1 | 0 |
| Reset LD | 0 | 1 | 1 | 1 | 0 |
| S4 – D4 | | | | | |
| Match | 0 | 1 | 1 | 0 | 0 |
| Counting | 0 | 1 | 1 | 1 | 0 |
| Reset LD | 0 | 1 | 1 | 1 | 0 |
| S5 – D5 | | | | | |
| Mismatch | 1 | 1 | 1 | 1 | 0 |
| Counting | 1 | 1 | 1 | 1 | 1 |
| Reset LD | 0 | 1 | 1 | 1 | 1 |

FIG. 5

| STATE | LD | L1 | L2 | L3 | L4 |
|---|---|---|---|---|---|
| Initial | 0 | 0 | 0 | 0 | 0 |
| S1 – D1 | | | | | |
| Mismatch | 1 | 0 | 0 | 0 | 0 |
| Overflow Check | 1 | 0 | 0 | 0 | 0 |
| Add | 1 | 1 | 0 | 0 | 0 |
| Reset LD | 0 | 1 | 0 | 0 | 0 |
| S2 – D2 | | | | | |
| Match | 0 | 1 | 0 | 0 | 0 |
| Overflow Check | 0 | 1 | 0 | 0 | 0 |
| Add | 0 | 1 | 0 | 0 | 0 |
| Reset LD | 0 | 1 | 0 | 0 | 0 |
| S3 – D3 | | | | | |
| Mismatch | 1 | 1 | 0 | 0 | 0 |
| Overflow Check | 1 | 1 | 0 | 0 | 0 |
| Add | 1 | 0 | 1 | 0 | 0 |
| Reset LD | 0 | 0 | 1 | 0 | 0 |
| S4 – D4 | | | | | |
| Mismatch | 1 | 0 | 1 | 0 | 0 |
| Overflow Check | 0 | 0 | 1 | 0 | 0 |
| Add | 0 | 0 | 1 | 0 | 0 |
| Reset LD | 0 | 0 | 1 | 0 | 0 |

Threshold = 2

FIG. 6

| LD | L1 | L2 | L3 | L4 |
|---|---|---|---|---|
| DATA | L1 | L2 | L3 | 0 |
| DATA | L1 | L2 | L3 | C1 (L1 & LD) |
| DATA | L1' (L1 xor LD) | L2 | L3 | C1 |
| C2 (C1 & L2) | L1' | L2 | L3 | C1 |
| C2 | L1' | L2' (L2 xor C1) | L3 | C1 |
| C2 | L1' | L2' | L3' (L3 xor C2) | C1 |

FIG. 7

PAGE BUFFER COUNTING FOR IN-MEMORY SEARCH

BACKGROUND

Field

Technology is described relating to in-memory searching in NAND flash memory and other types of memory, and implementations of in-memory searching systems suitable for large search words.

Description of Related Art

In-memory searching systems apply an input data set into a memory array, which compares the input data set to stored data, and outputs a result indicating a match or mismatch. In a NAND flash based in-memory searching system, an input data set can be applied to the word lines which are coupled to a NAND string storing a stored data word. Output of the NAND string indicates whether the input data set matches the stored data, and can be applied through a bit line to a page buffer.

When the length of the input data set to be subject of the in-memory searching exceeds the number of memory cells which can be accessed in a single cycle, such as in the NAND string embodiment which exceeds the number of memory cells usable for storing memory in the NAND string, the input data is divided into multiple search words and the stored data is distributed across multiple sets of data cells, such as multiple NAND strings. These multiple sets of data cells can be all connected to the same sense amplifier circuitry, such as in the case in which multiple NAND strings are connected to a single global bit line which links to one cell of the page buffer. The multiple search words are applied in sequence to the corresponding sets of data, and the matching results are accumulated. A single mismatch in the multiple search words can result in a mismatch for the entire input data set.

However, NAND flash memory and other types of memory technologies may be imperfect, such that one or more data cells in a set of data cells may store incorrect data. This can result in the case in which a fully matched stored data set will be judged mismatched due to a defect in the memory. In the case of a large input data set divided into multiple search words, the likelihood of misjudged searching is increased.

It is desirable therefore to provide technology, including improved in-memory searching, that can improve the efficiency of data processing for very large data sets.

SUMMARY

An in-memory searching (IMS) technology is described which is scalable to support very large input data sets.

A memory is described comprising an array of memory cells and a page buffer operably coupled to the array of memory cells. For example, the memory can be configured as a 3D NAND array, having a page buffer having page buffer cells coupled to bit lines. A search word input is operably coupled to the array of memory cells, such as a search word buffer coupled to word lines of a 3D NAND array. A circuit, such as string select gates or other decoding circuits, is provided to connect a selected set of memory cells in the array to the page buffer. The page buffer sensing circuitry is configured to apply a match sense signal to a storage element in a plurality of storage elements, such as latches or flip flops. The match sense signal indicates whether an input search word on the search word input matches a stored data word in the selected set of memory cells in the array. Logic circuitry is described using storage elements in the plurality of storage elements of the page buffer to accumulate the match sense signals output by the sensing circuitry over a sequence of a plurality stored data words and one or more input search words. A register can be provided to store a threshold. Logic can be provided to indicate a match for a stored data word based on the threshold and the accumulated match sense signals. In this manner, mismatches indicated due to a fault in a memory cell used in a part of the sequence can be avoided. Stored data words indicated as matching within the error tolerance established by the threshold, can be further processed as needed to handle errors in the memory array.

In one approach described herein, the logic circuitry using storage elements in the plurality of storage elements implements a shift register to accumulate match sense signals.

In another approach described herein, the logic circuitry using storage elements in the plurality of storage elements implements a counter to accumulate match sense signals.

An aspect of the technology described herein that can be applied in some implementations includes a controller to execute a memory operation in the array of memory cells such as read and program operations. The controller can use the plurality of storage elements also used to accumulate match sense signals in the page buffer in the memory operations.

The technology described herein provides a method for in-memory searching, including storing a plurality of stored data words in sets of the memory cells, such as cells in a NAND string, in an array of memory cells; applying input search words in sequence to a plurality of sets of memory cells in the array, such as by applying input search words to word lines of a NAND array; applying a match sense signal for the stored data word in each set of memory cells in the sequence to a storage element in a plurality of storage elements, such as storage elements of a page buffer cells, the match sense signal indicating whether an input search word matches the stored data word; using storage elements in the plurality of storage elements to accumulate the match sense signals over the sequence; and indicating a match or mismatch in response to a threshold and results of accumulation of the match sense signals over the sequence.

Other aspects and advantages of the present technology can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
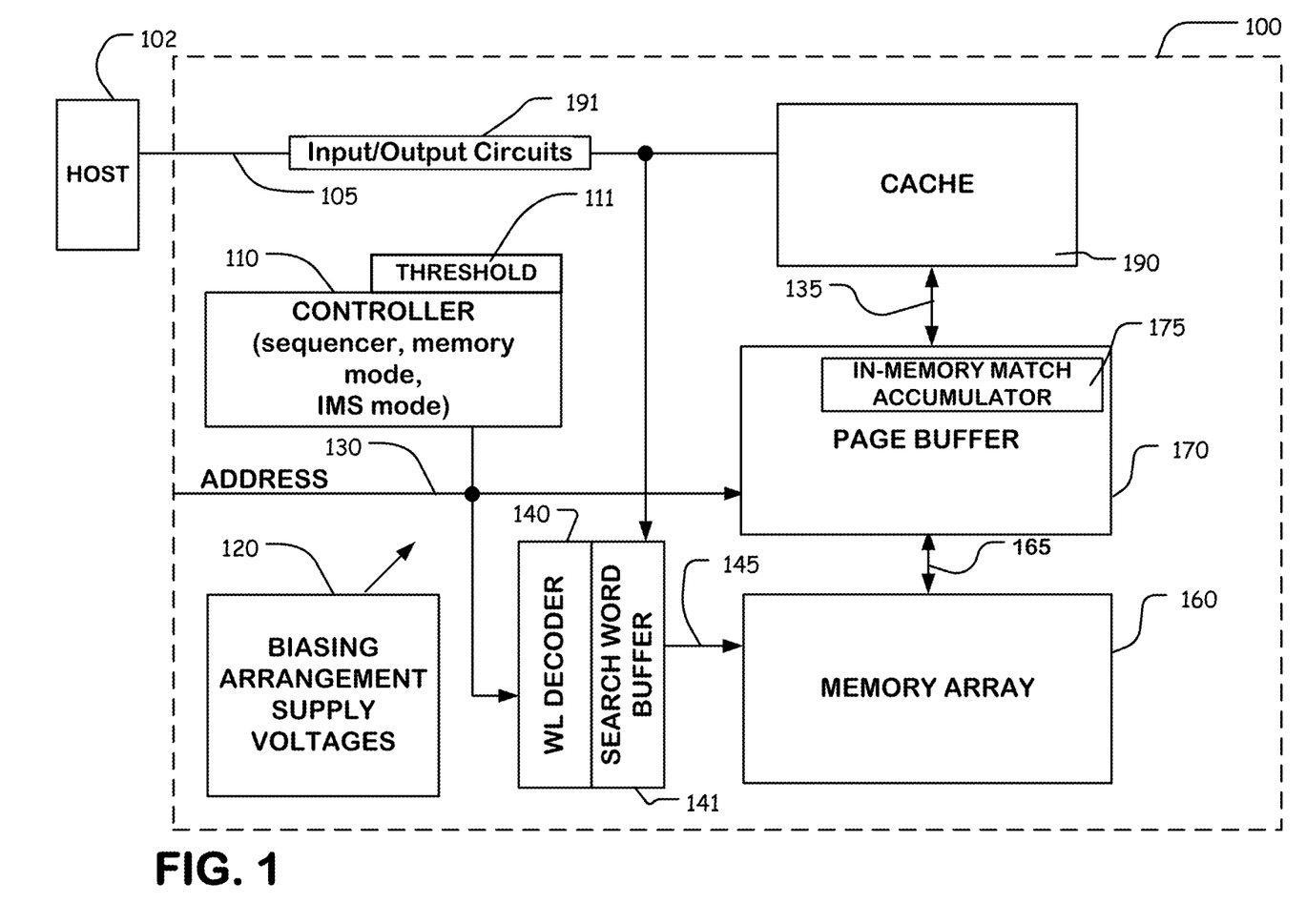
FIG. 1 is a simplified block diagram of an integrated circuit comprising memory configured for IMS using a sequence of search words, with in-memory match accumulator logic in the page buffer.
Figure 2:
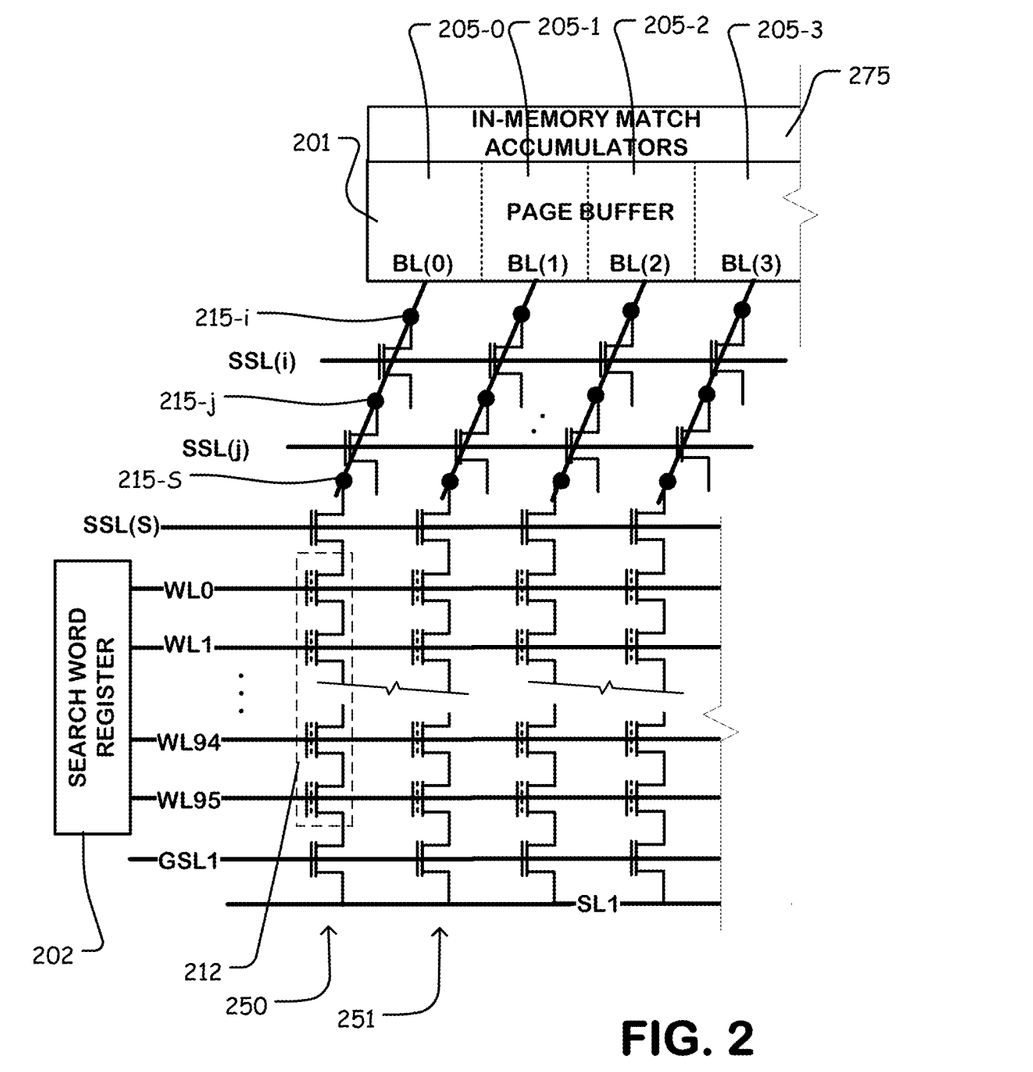
FIG. 2 is a simplified circuit diagram of a 3D nonvolatile NAND architecture configured for IMS, with in-memory match accumulator logic for individual page buffer cells of the page buffer.

FIG. 1 is a simplified chip block diagram of an embodiment of an integrated circuit memory device 100 including a memory array 160, such as a 3D NAND flash memory, implemented for example, as shown in FIG. 2. The memory device 100 is configured for memory operations, including for NAND flash embodiments page program, program, read, erase, or other operations, and for IMS operations. The memory device 100 can be implemented on a single integrated circuit chip, on a multichip module, or on a plurality of chips configured as suits a particular need.

The memory device 100 in this example includes a controller 110, that includes control circuits such as state machines and other logic circuits, for memory operations in a memory mode, and IMS operations in an IMS mode including a sequencer supporting sequential match operations as described herein. The controller 110 can include or have access to control registers storing parameters of operation of the device, including a threshold register 111 storing a parameter setting a threshold for sequential matching.

The memory array 160 can comprise floating gate memory cells or dielectric charge trapping memory cells configured to store multiple bits per cell, by the establishment of multiple program levels that correspond to amounts of charge stored, which in turn establish memory cell threshold voltages Vt. In various embodiments, the memory device 100 may have single-level cells (SLC), or multiple-level cells storing more than one bit per cell (e.g., MLC, TLC or XLC).

In other examples, the memory cells may comprise programmable resistance memory cells, ferro electric memory cells, phase change memory cells, and other types of non-volatile and volatile memory cell technologies.

The integrated circuit memory device 100 includes a set of bit lines 165 coupled to corresponding sets of memory cells in the memory array 160.

A set of word lines is coupled to gates of the memory cells in the memory array 160. A word line decoder 140 and a search word buffer 141 are coupled to a set of word lines 145, and configured to drive operational voltages for read and write operations in response to address decoding, and for IMS operations in response to input search words in the search word buffer 141.

The page buffer 170 is connected to bit lines 165. The page buffer 170 is coupled to a cache 190 in this example, which is in turn coupled to input/output circuits 191. The input/output circuits 191 connect via input/output pins to an external processing system, referred to as host 102.

The page buffer 170 can include a set of latches, or other types of storage elements, used in read and write (e.g. program and erase) operations and in IMS operations. For memory storage operations, input and output data can be provided through the cache 190 across lines 135. The page buffer 170 can be disposed on an integrated circuit in a manner such that the latches of the page buffer are disposed adjacent to, and operatively connected to, logic circuits for in-memory operations, including in-memory match accumulator logic 175 as described herein which uses one or more latches also used in the memory operations of the memory device to implement an in-memory match accumulator as described herein. In some embodiments, the logic circuitry 175 is disposed at the page buffer and also used for other memory operations, such as selecting a state in a program operation or clearing data after program verify.

Addresses are supplied on bus 130 from controller 110 to page buffer 170 and word line decoders 140.

Input/output circuits 191 drive the data to destinations external to the integrated circuit memory device 100. Input/output data and control signals are moved via data bus 105 between the input/output circuits 191, cache 190, the controller 110 and input/output ports on the integrated circuit memory device 100 or other data sources internal or external to the integrated circuit memory device 100, such as a general purpose processor or special purpose application circuitry, or a combination of modules providing system-on-a-chip functionality supported by the memory array 160.

The cache 190 can be used in the IMS mode for temporarily storing match results, such as stored words passing a similarity match, and metadata about the stored words subject of the IMS operations. Also, logic circuits can be connected to the cache and in the data path between the cache 190 and the page buffer 170, to do logic operations using the results of the IMS operations stored in cache.

In the example shown in FIG. 1, controller 110, using a bias arrangement state machine, controls the application of supply voltages generated or provided through the voltage supply or supplies in block 120 for IMS operations and for read and write (program and erase) operations in a storage mode.

The controller 110 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

A host 102 can be connected to the input/output circuits 191 on data bus 105 and include resources to support storage operations and IMS operations as described herein. The host 102 can comprise a general-purpose processor, a special purpose processor, a processor configured as a memory controller, or other processor that uses the memory device 100. All or part of the host 102 can be implemented on the same integrated circuit as the memory. In example systems, the host 102 can comprise a digital processing system including a memory controller to interface with the memory device 100, and may be a system including DRAM and GPU circuits in some examples, for further computations.

In the illustrated example, the host 102 is coupled to data bus 105 on the memory device 100, as well as other control terminals not shown, such as chip select terminals and so on, and can provide commands or instructions to the memory device 100. In some examples, the host 102 can be coupled to the memory device using a serial bus technology, using shared address and data lines.

The host 102 can include a file system or file systems that store, retrieve, and update data stored in the memory based on requests from an application program. In general, the host 102 can include programs that perform memory management functions and other functions that can produce status information for data stored in the memory. Also, the host 102 can include application programs, file systems, flash translation layer programs and other components that can produce status information for data.

Control logic in the controller 110 can also implement circuitry to support pipeline or sequential operations in an IMS mode of the device. For example, the following operations can be implemented using the control logic in the controller 110, after storage of a data set in the memory IMS sets of memory cells, a IMS operation can include:

1. Loading a first search word in the search word buffer 141.
2. Selecting a first stored word, such as by applying a string select voltage to a selected NAND string.
3. Applying the search word to the word lines for the selected stored word.
4. Storing an output of the sense amplifier for the selected set of storage cells in a storage element of the page buffer, the output indicating whether the selected stored word matches to the input search word. The in-memory match accumulator accumulates the results of the matches to the input search words across the sequence.
5. The controller determines whether the last search word has been searched in the procedure, and if not selects a next search word, and repeats steps 2 to 4.
6. If the last search word has been used, then the algorithm ends. If the in-memory match accumulator indicates that a threshold number of mismatches, or equivalently a threshold number of matches for some embodiments, then the input data set is indicated as a mismatch for the stored data in selected sets of data cells served by the IMS match accumulator in the page buffer.

In some embodiments, the controller can stop the sequence in the event that the in-memory match accumulator reaches a threshold before completion of the sequence.

FIG. 2 is a schematic diagram of a NAND block including an array of vertical NAND strings arranged in rows and columns. A row in a NAND block for the purposes of this description is a set of NAND strings having a common string select line (e.g. SSL(S)), and common word lines (WL0 to WL95). Each NAND string in the row is coupled to a different bit line in response to the common string select line, so that they are logically arranged in a row along the common string select line and word lines.

A NAND block as described herein can be implemented using a 3D NAND memory technology. Some examples, among a variety of alternatives known in the art, of NAND blocks include vertical NAND stacks. Implementations can also be made using 2D NAND technology, in which the NAND block is logically defined across the plurality of 2D NAND arrays.

The diagram shows one row of vertical NAND strings of a NAND block having string select line SSL(S). Multiple rows are included in a block on respective string select lines (SSL(i) and SSL(j)) shown schematically. For the purposes of this description a column of NAND strings is a set of NAND strings having a common bit line (e.g., at points 215-S, 215-*j* and 215-*i* on bit line BL(0)), each NAND string in the column coupled to a different string select line, so that they are arranged logically in a column along the common bit line and can be selected one at a time for connection to their corresponding bit line. In physical layout, a column or a row may be twisted, arranged in a honeycomb pattern or otherwise laid out for high density or for other reasons according to the manufacturing method applied.

In the diagram, a NAND string 250 and a NAND string 251 in a first row of the array are coupled to a first bit line BL(0) and second bit line BL(1) respectively, and to a shared source line SL1 for the row.

It is contemplated that a given NAND block can be coupled to many bit lines BL(i), for i going from 1 to B, including tens, hundreds or thousands of bit lines in a given implementation, along with corresponding numbers of columns of NAND strings in the array of NAND strings.

Each of the NAND strings in the block of NAND strings includes a string select switch coupled to a corresponding string select line (e.g., SSL(S)), which is used to connect and disconnect the corresponding NAND string to its bit line. It is contemplated that a given NAND block can be coupled to many string select lines, in a given implementation, along with corresponding numbers of rows of NAND strings in the array of NAND strings.

Each of the NAND strings in the array of NAND strings includes a ground select switch coupled to a ground select line GSL1 for the row, which is used to connect the corresponding NAND strings in the row of NAND strings to the source line SL1 for the row. In some embodiments, the shared source line may be connected to all the NAND strings in the block, or to portions of the NAND strings in the block other than a single row. In some embodiments, the ground select switches on corresponding NAND strings can be controlled by separate ground select lines.

Each of the NAND strings in the array of NAND strings includes a plurality of memory cells arranged in series between the string select switch and the ground select switch, coupled to corresponding word lines. In this example, each of the word lines in a given level of the NAND block is coupled to separately controlled, single word line conductors, such that each row of memory cells in a given level can receive a different word line signal. In some embodiments, all the word lines or a set of word lines including more than one member, in a given level of a block are coupled to a single word line conductor, so all, or a selected plurality of, the rows of memory cells in a given level of the NAND block can receive the same word line signal. In this example, the NAND strings of the NAND block are vertical NAND strings including 96 levels of memory cells coupled to 96 word lines WL0-WL95. There can be different numbers of levels of word lines in different embodiments, including 200 or more levels in some technologies.

In a storage mode of operation, data can be written into the individual memory cells using program and erase operations supported by a page buffer 201, coupled to the plurality of bit lines of the block. In the storage mode operations, typically, one of the rows of NAND strings in the array of NAND strings is selected using a selected string select line. In this case, one of the NAND strings in each column of the array of NAND strings is coupled to one of the bit lines. A page buffer can be utilized to program a data pattern into the individual NAND strings in a selected row of the array of NAND strings coupled to a plurality of bit lines in parallel at each level of the NAND block. Also, the page buffer in the storage mode can be utilized to read data stored in the memory cells in a selected row of the array of NAND strings at each level of the NAND block.

In a storage mode, a large data set of data words can be stored into the NAND block.

A system including the NAND block illustrated in FIG. 2 is an example circuit including an array of memory cells arranged to hold stored words in respective NAND strings. A data set that comprises a plurality of stored words, each stored word in this example being stored in one NAND string. Thus, in this example a data set can include multiple data words stored in NAND strings along a column of the array connected to a common bit line. Thus, for a given data set, a first data word is stored in the memory cells 212 of NAND string 250 selected by SSL(S) and bit line BL(0). A second data word of the given data set is in the memory cells of a NAND string selected by SSL(j) at point 215-j and bit line BL(0). A third data word of the given data set is in the memory cells of a NAND string selected by SSL(i) at point 215-i and bit line BL(0).

The circuit of FIG. 2 includes a circuit to select a set of memory cells in the sets of memory cells storing a given data set, where in this example a set of memory cells includes the memory cells in a NAND string. For an in-memory search operation, two memory cells in a NAND string can be used for each bit of a stored data word, with true and complement versions of the data bit stored in the two memory cells. Likewise, the input search word can use two word lines per search bit, with true and complement values of each search bit applied on the two word lines per search bit. In this manner, a ternary search can be executed, searching for logic "1", logic "0" and a don't care "X" value in bits of either the stored data words, input search words or both. Using the structure, current flows through the NAND string to the corresponding page buffer cell, if all of the bits of the input search word match corresponding bits of the stored data word; and no current flows through the NAND string if at least one of the bits of the input search word does not match the corresponding bit of the stored data word.

The circuit to select the set of memory cells can comprise a string select line decoder and driver responsive to addresses from a controller, as used in nonvolatile memory circuits.

The circuit of FIG. 2 includes a circuit to apply an input search word to memory cells in the selected set of memory cells. In this example, a search word register 202 is coupled to the word lines WL(0) to WL(95), and the selected set of memory cells includes the memory cells 212 on a NAND string selected by a string select line (e.g. SSL(S)) on a selected bit line (e.g. BL(0)). A sequence of selected sets of cells which store data words for a data set to be matched with respective input search words for an input data set, can include the memory cells on a plurality of the NAND strings coupled with the single bit line (e.g. BL(0)), selected in sequence by sequencing through the string select lines including in this example SSL(S), SSL(j), SSL(i) . . . .

In the configuration of FIG. 2, the input search words can be applied simultaneously to NAND strings on multiple bit lines allowing parallel searching to match an input data set with multiple stored data sets, where the stored data sets are accessed using different bit lines.

In other embodiments, sense amplifiers for match conditions can be connected to source lines, such as source line SL1, the input search words can be applied using the page buffer to bit lines, and the stored data words can be selected using word lines. With the source line sensing, a circuit including a page buffer cell, as described herein, can be coupled to the source line to perform in-memory match accumulation using techniques described herein. The page buffer cell with match accumulation logic used for source line sensing can be part of the page buffer utilized for read, program and erase operations, or can be an additional page buffer cell. Also, in other embodiments, memory architectures other than NAND architectures can be used. For example, a NOR architecture memory can be used.

As illustrated in FIG. 2, the page buffer 201 includes a plurality of page buffer cells 205-0, 205-1, 205-2, 205-3 . . . , where each page buffer cell is coupled to a corresponding bit line BL(0), BL(1), BL(2), BL(3) . . . . The page buffer includes logic circuitry 275 to implement in-memory match accumulators for each page buffer cell. The in-memory match accumulators can use storage elements of the page buffer to implement an accumulator, such as an adder or shift register, to accumulate match data for a plurality of stored data words accessed using a single bit line. In this manner, a search can be implemented that generates information concerning the number of matches or mismatches for an input data set distributed across a plurality of input search words, and logic can signal a match or a mismatch depending on a threshold number generated using the accumulator for each bit line, of matches or mismatches across the input data set.

Figure 3:
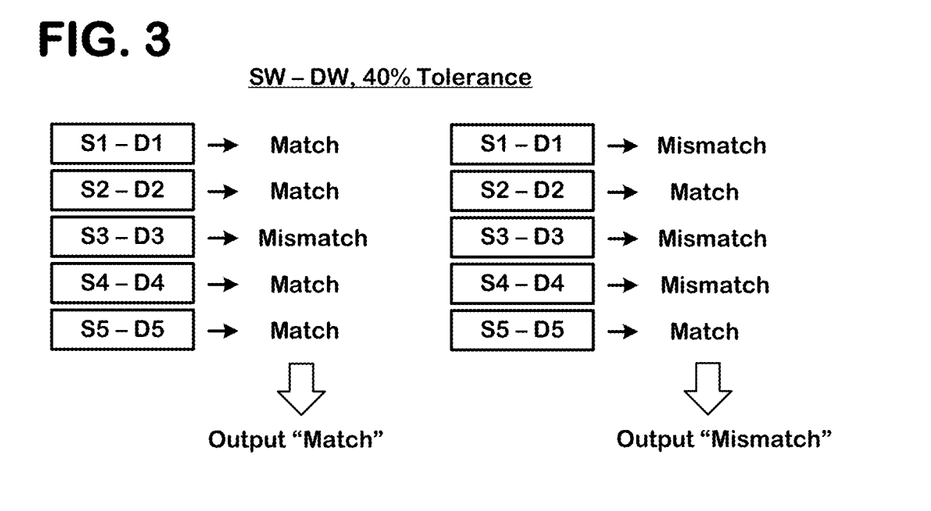
FIG. 3 is an illustration of match and mismatch conditions which can be generated using the IMS systems as described herein, for an input data set which is divided into five input search words applied in sequence.

FIG. 3 is an illustration of match and mismatch conditions which can be generated using the IMS systems as described herein, for an input data set SW which is divided into five input search words S1, S2, S3, S4, S5, applied in sequence to sets of memory cells storing stored data words D1, D2, D3, D4, D5. For the purposes of illustration, the threshold sets a 40% tolerance, requiring at least 40% of the search data words to mismatch the corresponding input search words in order to characterize the search results as a mismatch. Thus, as seen in the first column of FIG. 3, in the case in which S1 matches D1, S2 matches D2, S4 matches D4, and S5 matches D5, and S3 and D3 are a mismatch, the output of the search operation would indicate a match. As seen in the second column of FIG. 3, in the case in which, S2 matches D2 and S5 matches D5, and S1 and D1, S3 and D3 and S4 and D4 are mismatches, the output of the search operation would indicate a mismatch. The threshold can be set at any tolerance value that suits a particular implementation.

Figure 4:
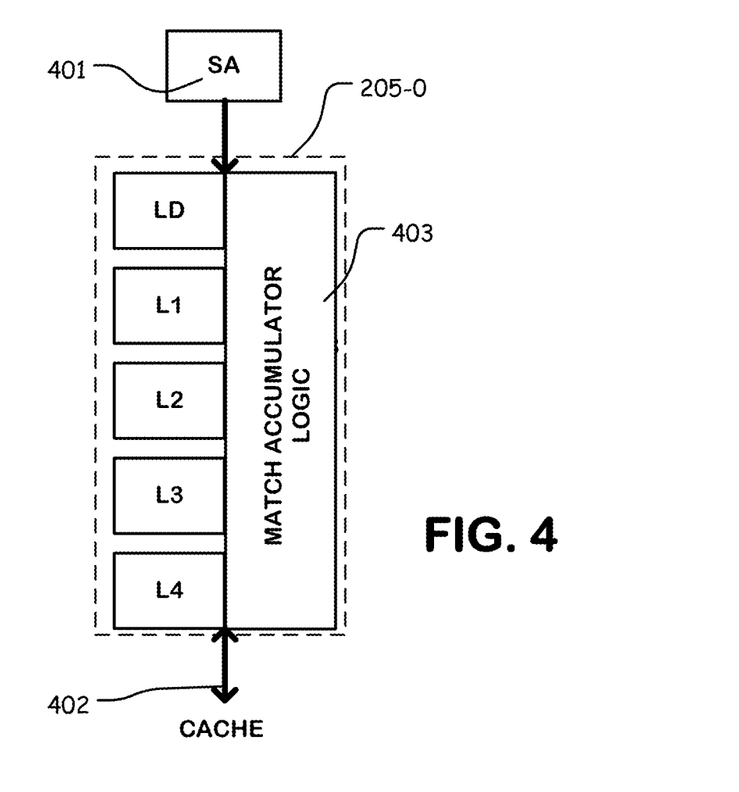
FIG. 4 is a simplified circuit diagram of a page buffer cell with in-memory match accumulator logic, suitable for use in a system like that of FIG. 2.

FIG. 4 is a simplified block diagram of a page buffer cell, such as the page buffer cell 205-0 of FIG. 2, which might be applied for use in NAND flash memory storing three levels per cell (TLC). The page buffer cell can be adapted as suits a particular implementation for other memory architectures and memory cell implementations, including single level cells (SLC), double level cells (MLC), quadruple level cells (QLC) and higher (XLC). In this example, the page buffer cell 205-0 includes a sense amplifier 401 connected to an output of a set of data cells, such as a bit line as described with reference to FIG. 2. The page buffer cell includes a plurality of storage elements, including latches LD, L1, L2, L3, L4 in the figure. The page buffer cell 205-0 is coupled on bus 402 to a cache memory or otherwise coupled to input/output circuitry for the memory device. The latches LD, L1, L2, L3, L4 are used in memory operations for the memory array, including read operations, program operations and so on. For example, using triple level cell TLC technology, each page buffer cell may include 5 latches, where 3 latches (e.g., L1 to L3) are used for data input for programming, the other 2 (e.g. LD and L4) are used for bit-line level controlling, program verify data storing, quick-pulse-write data storing, and so on, in support of the programming operation. Also, multiple ones of the latches LD, L1, L2, L3, L4 can be used to store the results of reading multiple bits per cell in a read operation in a TLC technology memory array. In the embodiment of FIG. 4, match accumulator logic 403 is included that utilizes one or more of the latches LD, L1, L2, L3, L4 to implement an accumulator, such as a shift register or adder, which performs in-memory accumulation of match results for a sequence of operations over multiple stored data words. In one example accumulation operation, the output of a search operation can be applied in one latch, such as latch LD, and the other four latches L1 to L4 can be used by the match accumulator logic 403 for implementation of the accumulator.

As mentioned above, in one embodiment the match accumulator logic implements a shift register in each page buffer cell. Thus, for a page buffer cell like that of FIG. 4, match accumulator logic will implement the following:

$$L4=L4\|(L3\&LD)$$

$$L3=L3\|(L2\&LD)$$

$$L2=L2\|(L1\&LD)$$

$$L1=L1\|LD$$

Figure 5:
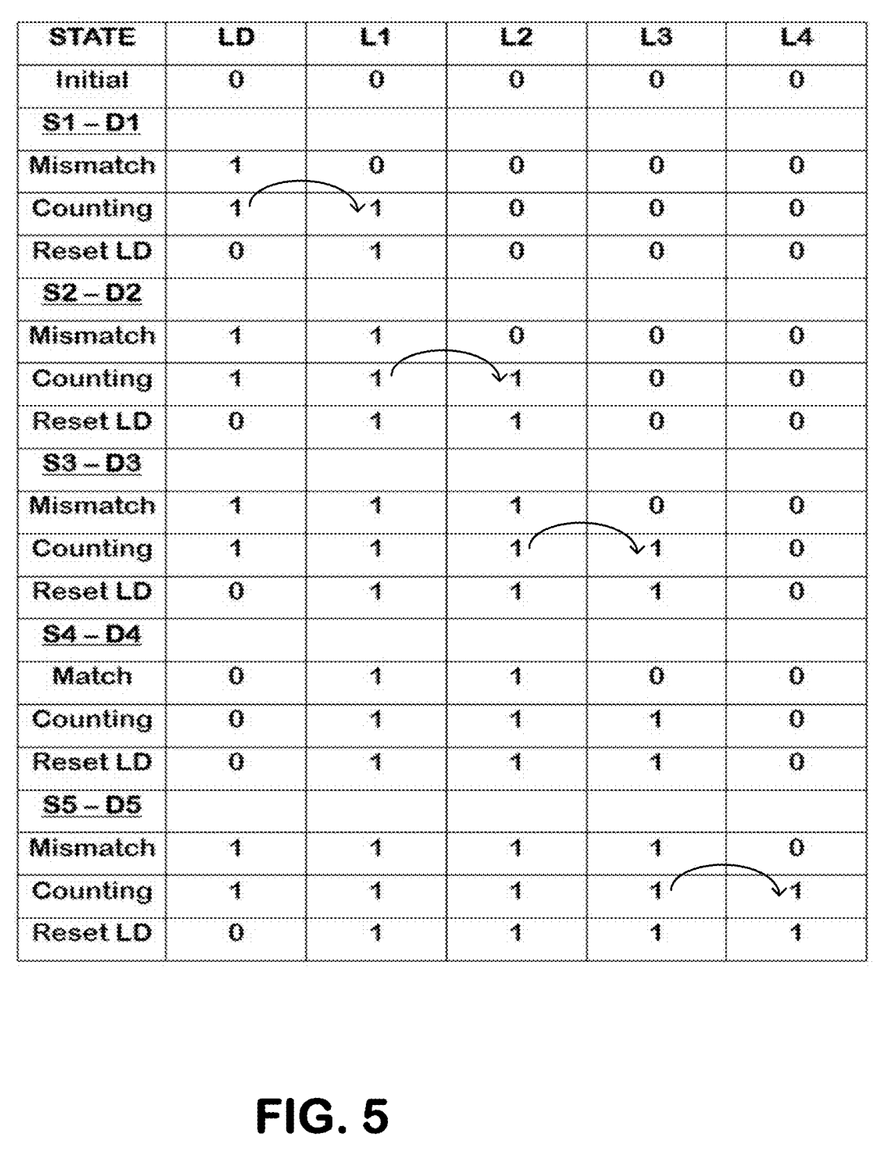
FIG. 5 illustrates operation of a shift register based accumulator logic which can be implemented using the storage elements of the page buffer cell, like that of FIG. 4.

The table shown in FIG. 5 illustrates the shift register operation. The first column of the table illustrates the state of the accumulator logic for a sequence of input search words. The second through sixth columns of the table illustrates the state of the latches LD to L4 as used to implement a shift register for match accumulation.

In the initial state, all the latches are reset to logic "0".

In a next state, the array is accessed to match search word S1 to stored data word D1, and results are stored in latch LD. In this example, the result is a mismatch setting latch LD to logic "1". The page buffer clock can be incremented perform the shift register accumulator operation. As illustrated above, latch L1 is set to a result "1" of the operation L1 or LD. The latches L2 to L4 remain at "0" as a result of the respective operations listed above. In a next cycle of the page buffer clock, the latch LD is reset, leaving the logic "1" in latch L1, and all other latches at "0".

In a next state, the array is accessed to match search word S2 to stored data word D2, and results are stored in latch LD. In this example, the result is a mismatch setting latch LD to logic "1". As illustrated above, latch L1 is set to a result "1" of the operation (L1 or LD). The latch L2 is set to a result "1" of the operation (L2 or (L1 & LD)). The latches L3 to L4 remain at "0" as a result of the respective operations listed above. In a next cycle of the page buffer clock, the latch LD is reset, leaving the logic "1" in latches L1 and L2, and all other latches at "0".

In a next state, the array is accessed to match search word S3 to stored data word D3, and results are stored in latch LD. In this example, the result is a mismatch setting latch LD to logic "1". As illustrated above, latch L1 is set to a result "1" of the operation (L1 or LD). The latch L2 is set to a result "1" of the operation (L2 or (L1 & LD)). The latch L3 is set to a result "1" of the operation (L3 or (L2 & LD)). The latch L4 remains at "0" as a result of the operation listed above. In a next cycle of the page buffer clock, the latch LD is reset, leaving the logic "1" in latches L1, L2 and L3, and all other latches at "0".

In a next state, the array is accessed to match search word S4 to stored data word D4, and results are stored in latch LD. In this example, the result is a match setting latch LD to logic "0". As illustrated above, latch L1 is set to a result "1" of the operation (L1 or LD). The latch L2 is set to a result "1" of the operation (L2 or (L1 & LD)). The latch L3 is set to a result "1" of the operation (L3 or (L2 & LD)). The latch L4 remains at "0" as a result of the operation (L4 or (L3 & LD)). In a next cycle of the page buffer clock, the latch LD is reset, leaving the logic "1" in latches L1, L2 and L3, and all other latches at "0".

In a next state, the array is accessed to match search word S5 to stored data word D5, and results are stored in latch LD. In this example, the result is a mismatch setting latch LD to logic "1". As illustrated above, latch L1 is set to a result "1" of the operation (L1 or LD). The latch L2 is set to a result "1" of the operation (L2 or (L1 & LD)). The latch L3 is set to a result "1" of the operation (L3 or (L2 & LD)). The latch L4 remains at "1" as a result of the operation (L4 or (L3 & LD)). In a next cycle of the page buffer clock, the latch LD is reset, leaving the logic "1" in latches L1, L2, L3 and L4, and latch LD at "0". In this case, the shift register implemented using latches L1 to L4 is full, indicating detection of 4 mismatches across the sequence of 5 stored data words.

The output of the shift register can be compared to a threshold to indicate a match or mismatch condition as discussed above, using for example logic in the controller, comparators in the page buffer, or using resources of the host system.

Use of shifter register logic limits the counting range to the number of storage elements used to implement the shift register. For a page buffer cell including a number L latches, one of which is used to store sensing results, the maximum number which can be counted using the cell using the technique of FIG. 5, without additional latches, is L−1. Counter logic can achieve a higher range using a given number of latches.

As mentioned above, in one embodiment the match accumulator logic implements an adder in each page buffer cell.

Figure 6:
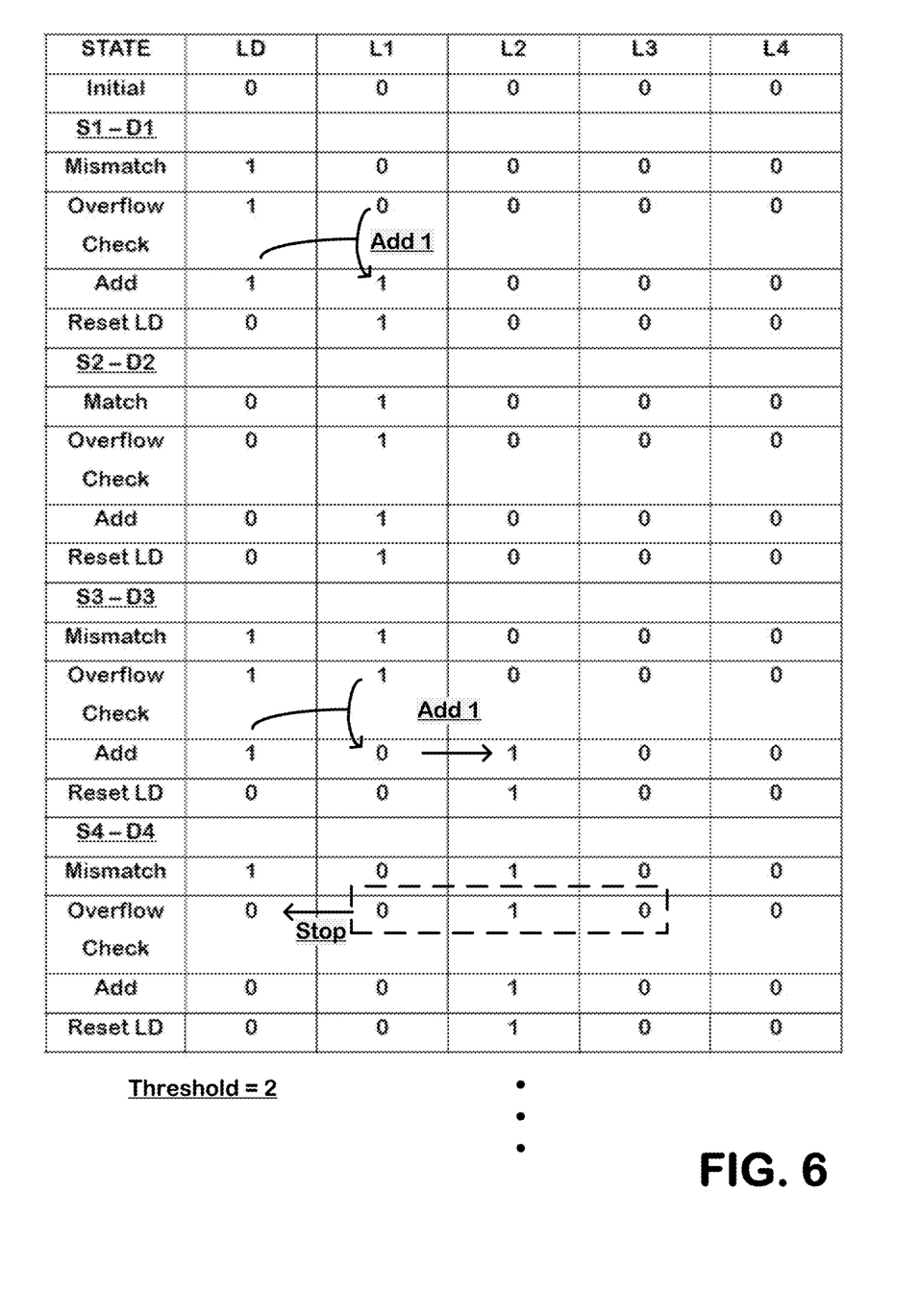
FIG. 6 illustrates operation of a counter based accumulator logic which can be implemented using the storage elements of the page buffer cell, like that of FIG. 4.

The table shown in FIG. 6 illustrates an adder operation, assuming a threshold of 2. The first column of the table illustrates the state of the accumulator logic for a sequence of input search words. The second through sixth columns of the table illustrates the state of the latches LD to L4 as used to implement a shift register for match accumulation. Latch LD is used for fetching the search result for the accessed store data word. Latches L1 to L3 are used for counting, and latch L4 is used for carry storage in support of the counting. In this case, where L is the total number of latches in the page buffer cell, the maximum count is $2^{(L-2)}-1$.

In an adder implementation, the search result for each stored data word in the sequence is latched in LD, and a threshold check can be performed in a logic circuit coupled to, or part of, the page buffer cell, to detect an overflow of the mismatch threshold. If the threshold overflow is detected in a cycle including a mismatch result, then Latch LD is reset before the adding logic is enabled. For the illustrated example, the threshold can be set from 1 to 7. In the example, the threshold is 2.

Referring to FIG. 6, in the initial state, all the latches are reset to logic "0".

In a next state, the array is accessed to match search word S1 to stored data word D1, and results are stored in latch LD. In this example, the result is a mismatch setting latch LD to logic "1". The page buffer clock can be incremented perform subsequent steps in the counting operation. In the next clock, the threshold overflow check is executed, and no overflow is detected, so latch LD remains at result "1". Next, LD is added to the value in L1 to L3, resulting in this example in setting L1 to 1, while L2 and L3 remain 0, and L4 remains 0. In a next cycle of the page buffer clock, the latch LD is reset, leaving the logic "1" in latch L1, and all other latches at "0".

In a next state, the array is accessed to match search word S2 to stored data word D2, and results are stored in latch LD. In this example, the result is a match setting latch LD to logic "0". The page buffer clock can be incremented perform subsequent steps in the counting operation. In the next clock, the threshold overflow check is executed, and no overflow is detected, so latch LD remains at result "0". Next, LD is added to the value in L1 to L3, resulting in this example in L1 remaining at 1, while L2 and L3 remain 0, and L4 remains 0. In a next cycle of the page buffer clock, the latch LD is reset, leaving the logic "1" in latch L1, and all other latches at "0".

In a next state, the array is accessed to match search word S3 to stored data word D3, and results are stored in latch LD. In this example, the result is a mismatch setting latch LD to logic "1". The page buffer clock can be incremented perform subsequent steps in the counting operation. In the next clock, the threshold overflow check is executed, and no overflow is detected, so latch LD remains at result "1". Next, LD is added to the value in L1 to L3, resulting in this example in setting L1 to 0, and L2 to 1, while L3 remains 0, and L4 remains 0. In a next cycle of the page buffer clock, the latch LD is reset, leaving the logic "1" in latch L2, and all other latches at "0".

In a next state, the array is accessed to match search word S4 to stored data word D4, and results are stored in latch LD. In this example, the result is a mismatch setting latch LD to logic "1". In the next clock, the threshold overflow check is executed, and for a threshold of 2, and overflow is detected. This results in a reset of latch LD to "0". Next, because LD is "0" as a result of threshold overflow, the search sequence can continue, and the threshold matching performed after completion of the sensing. Alternatively, the adding can be stopped in some embodiments, and the search sequence can be stopped.

The page buffer with five storage elements per cell, like that described with respect to FIG. 4, therefore can used to implement a three-bit counter circuit of FIG. 6.

Figure 7:
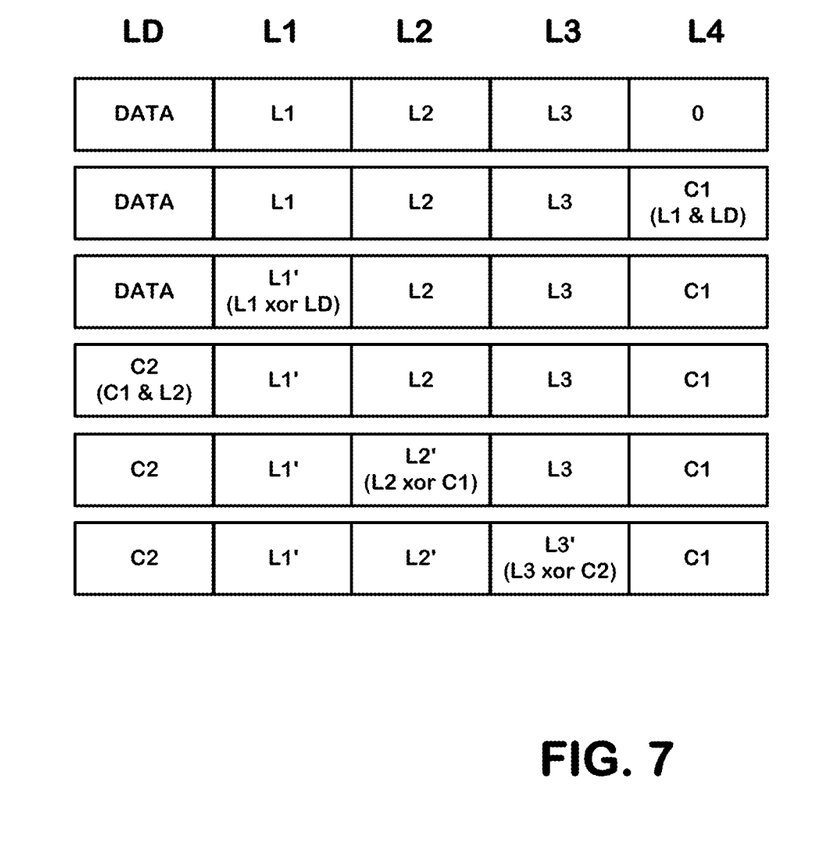
FIG. 7 illustrates logic of a counter based accumulator logic implemented using storage elements of the page buffer cell such as discussed with reference to FIG. 4.

FIG. 7 illustrates logic implemented using storage elements of the page buffer cell such as discussed with reference to FIG. 4, as an example of circuits to implement an adding step suitable for the system of FIG. 6, using the latches LD, and L1 to L4, in six steps, for results of matching one stored data word in a sequence of data words. In this example, the contents of latch LD are tracked in the first column, and the contents of latches L1 to L4 are tracked in the second through fifth columns respectively. In a first state, the data stored in latches L1 to L3 represents values from the match results for previous stored data word in the sequence. Latch LD captures the results for the current stored data word. Latch L4 is set to "0". The second state, latch L4 is set to a carry bit C1 based on the logic function (L1 & LD) executed by a logic circuit linked to the page buffer cell. In the third state, latch L1 is updated to store the value L1' based on the logic (L1 xor LD), executed by a logic circuit linked to the page buffer cell. A fourth state, the latch LD is updated to a second carry bit C2 based on the logic function (C1 & L2) executed by a logic circuit linked to the page buffer cell. In a fifth state, the latch L2 is updated to value L2' based on the logic function (L2 xor C1) executed by a logic circuit linked to the page buffer cell. In a sixth state, the latch L3 is updated to value L3' based on the logic function (L3 xor C2) executed by a logic circuit linked to the page buffer cell.

Using this example, the results of the adding step for each cycle can be characterized as follows:

$$3'b\ L3'L2'L1' = 3'b\ L3L2L1 + 3'b001,\ \text{if Data in Latch}\ LD=1,\ \text{and}$$

$$3'b\ L3'L2'L1' = 3'b\ L3L2L1,\ \text{if Data in Latch}\ LD=0.$$

After completion of the cycling in sequence matching all of the input search words to the corresponding the stored data words, the output indicating a match or mismatch depends on the tolerance threshold. For example, if the threshold is two, and the output would be "match" if latches L3:L1<010, and "mismatch" if the laches L3:L1=010. If the threshold is seven, the output would be "match" if L3:L1<111, and "mismatch" if the laches L3:L1=111. If the threshold were six, the output would be "match" if L3:L1<110, and "mismatch" if the laches L3:L1=110; and so on for other threshold values.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
    an array of memory cells and a page buffer operably coupled to the array of memory cells;
    a search word input operably coupled to the array of memory cells;
    a circuit to connect a selected set of memory cells in the array to the page buffer;
    wherein the page buffer includes a plurality of storage elements, and sensing circuitry configured to apply a match sense signal to a storage element in the plurality of storage elements, the match sense signal indicating whether an input search word on the search word input matches a stored data word in the selected set of memory cells in the array; and
    logic circuitry to accumulate the match sense signals over a sequence of input search words using storage elements in the plurality of storage elements of the page buffer.

2. The memory of claim 1, wherein the array of memory cells comprises an array of NAND strings, each NAND string in the array including a set of memory cells connected in series, and wherein the circuit to connect a selected set of memory cells to the page buffer selects a NAND string.

3. The memory of claim 1, including bit lines connecting the array of memory cells to the page buffer, and the page buffer includes a plurality of storage elements and sensing circuitry for each bit line in a plurality of the bit lines, configured to apply respective match sense signals to a storage element in the plurality of storage elements; and
    the logic circuitry using storage elements in the plurality of storage elements of the page buffer accumulates the match sense signals for each bit line in the plurality of bit lines.

4. The memory of claim 3, wherein the plurality of storage elements includes four or more storage elements for each bit line in the plurality of bit lines.

5. The memory of claim 1, wherein the logic circuitry using storage elements in the plurality of storage elements implements a shift register to accumulate match sense signals.

6. The memory of claim 1, wherein the logic circuitry using storage elements in the plurality of storage elements implements a counter to accumulate match sense signals.

7. The memory of claim 1, including a controller to execute a memory operation in the array of memory cells, the controller using the plurality of storage elements in the page buffer for the memory operation.

8. The memory of claim 1, including a register to store a threshold, and logic to indicate a match for a stored data word based on the threshold.

9. A memory comprising:
an array of memory cells, including a plurality of bit lines and a plurality of word lines, the memory cells in the array configured in a plurality of NAND strings having string select transistors responsive to string select signals for connection to corresponding bit lines in the plurality of bit lines;
a page buffer, including a plurality of page buffer cells operably connected to bit lines in the plurality of bit lines; and
a search word input operably coupled to the plurality of word lines;
wherein a page buffer cell in the plurality of page buffer cells includes a plurality of storage elements, sensing circuitry configured to apply a match sense signal from the bit line of the page buffer cell to a storage element in the plurality of storage elements, the match sense signal indicating whether an input search word on the plurality of word lines matches a stored data word in a NAND string connected to the bit line of the page buffer cell, and logic circuitry using storage elements in the plurality of storage elements of the page buffer cell to accumulate match sense signals for stored data words from NAND strings connected in sequence to the bit line of the page buffer cell.

10. The memory of claim 9, wherein the plurality of storage elements of a page buffer cell includes four or more storage elements.

11. The memory of claim 9, wherein the logic circuitry using storage elements in the plurality of storage elements implements a shift register to accumulate match sense signals.

12. The memory of claim 9, wherein the logic circuitry using storage elements in the plurality of storage elements implements a counter to accumulate match sense signals.

13. The memory of claim 9, including a controller to execute a memory operation in the array of memory cells, the controller using the plurality of storage elements in the page buffer cells for the memory operation.

14. The memory of claim 9, including a register to store a threshold, and logic to indicate a match for a stored data word based on the threshold.

15. A method for operating a memory for in-memory searching, the memory including an array of memory cells and logic circuitry, the method comprising:
storing a plurality of stored data words in sets of memory cells in the array of memory cells of the memory;
applying input search words in sequence to a plurality of sets of memory cells in the array;
applying a match sense signal for the stored data word in each set of memory cells in the sequence to a storage element in a plurality of storage elements of a page buffer, the match sense signal indicating whether an input search word matches the stored data word;
implementing the logic circuitry of the memory to accumulate the match sense signals over the sequence of input search words using storage elements in the plurality of storage elements; and
indicating a match or mismatch in response to a threshold and results of the accumulation of the match sense signals over the sequence 1.

16. The method of claim 15, wherein the array of memory cells comprises an array of NAND strings.

17. The method of claim 15, wherein the array of memory cells includes bit lines connecting the array of memory cells to a page buffer, and the page buffer includes a plurality of page buffer cells having sensing circuitry for each bit line in a plurality of the bit lines, a page buffer cell in the plurality of page buffer cells including the plurality of storage elements, the method including applying respective match sense signals to the plurality of page buffer cells in parallel.

18. The method of claim 15, including configuring the plurality of storage elements as a shift register to accumulate the match sense signals over the sequence.

19. The method of claim 15, including configuring the plurality of storage elements as a counter to accumulate the match sense signals over the sequence.

20. The method of claim 15, including executing a memory operation in the array of memory cells, using the plurality of storage elements for the memory operation.

* * * * *